US006994480B2

(12) United States Patent
Inujima et al.

(10) Patent No.: US 6,994,480 B2
(45) Date of Patent: Feb. 7, 2006

(54) OPTICAL LINK MODULE

(75) Inventors: Takayoshi Inujima, Yokohama (JP); Kazushige Oki, Yokohama (JP); Hiromi Kurashima, Yokohama (JP); Eiji Tsumura, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 234 days.

(21) Appl. No.: 10/378,660

(22) Filed: Mar. 5, 2003

(65) Prior Publication Data

US 2003/0198445 A1 Oct. 23, 2003

(30) Foreign Application Priority Data

Mar. 5, 2002 (JP) .......................... P2002-059077

(51) Int. Cl.
*G02B 6/43* (2006.01)

(52) U.S. Cl. .......................................... 385/92; 257/82

(58) Field of Classification Search ............ 385/88–94
See application file for complete search history.

(56) References Cited

U.S. PATENT DOCUMENTS

| | | | |
|---|---|---|---|
| 5,039,194 A | 8/1991 | Block et al. | |
| 5,631,988 A * | 5/1997 | Swirhun et al. | 385/89 |
| 6,142,802 A | 11/2000 | Berg et al. | |
| 6,200,041 B1 | 3/2001 | Gaio et al. | |
| 6,206,582 B1 | 3/2001 | Gilliland | |
| 2002/0154362 A1 | 10/2002 | Oki et al. | |
| 2003/0063397 A1 | 4/2003 | Inujima et al. | |
| 2003/0063424 A1 | 4/2003 | Inujima et al. | |
| 2003/0152340 A1 | 8/2003 | Kurashima | |

* cited by examiner

*Primary Examiner*—Frank G. Font
*Assistant Examiner*—Michael P. Mooney
(74) *Attorney, Agent, or Firm*—McDermott Will & Emery LLP

(57) ABSTRACT

An optical link module comprises a transmitting optical sub-assembly (TOSA), a receiving optical subassembly (ROSA), a board and electronic parts. The electronic parts are necessary for wire-bonding to connect electronic thereto and mounted only on either the first surface or the second surface of the board.

11 Claims, 5 Drawing Sheets

OPTICAL LINK MODULE

BACKGROUND OF THE INVENTION

1. Field of the Invention

The present invention relates to an optical link module.

2. Related Prior Art

Optical link modules are widely used in data links and in optical communication systems such as optical LAN, which uses light as an information transmitting means.

As is shown in FIG. 5, a conventional optical link module 100 comprises a housing 102, and a board 106 disposed on the bottom surface 104 of the housing 102. A transmitting optical sub-assembly (TOSA) 108, and a receiving optical sub-assembly (ROSA) 108, electronic parts 110 are mounted on the board. The respective lead pins 112 of the TOSA 108 and the ROSA are bent to-up-and-down direction. When the TOSA and the ROSA are placed on the board 106, the lead pins 112 are inserted and soldered into through holes in the board 106.

In the conventional module, a high degree of integration is achieved by mounting electronic parts utilizing both a front and a back surfaces of the board. For example, electronic parts relating to a transmitting function are mounted on the front surface of the board, while those relating to a receiving function are mounted on the back surface of the board. However, if electronic parts that are necessary for wire-bonding are mounted on both the front surface and the back surface of the board, two wire-bonding processes are required for the respective surface of the board. This reduces a productivity of the module.

SUMMARY OF THE INVENTION

It is an object of the present invention to provide an optical module that achieves a high degree of integration and an improved productivity without increasing the size of the module.

An optical link module of the present intention comprises a transmitting optical sub-assembly (TOSA), a receiving optical sub-assembly (ROSA), a board and electronic parts. The electronic parts are necessary for wire-bonding to connect electronic thereto and mounted only on either the first surface or the second surface of the board.

In this optical link module, since a plurality of electronic parts including those requiring the wire-bonding are mounted on both surfaces of the board, a higher degree of the integration can be attained without increasing the size of the module. Since the electronic parts requiring the wire-bonding are mounted only on either the first surface or the second surface of the board, the wire-bonding is necessary for the one surface of the board, thus enhancing the productivity of the module.

In the optical link module of the present invention, a transmitting circuit is preferably installed on either the first surface or the second surface of the board, while a receiving circuit is preferably installed on the other surface of the board. This configuration enables the crosstalk between the transmitting circuit and the receiving circuit to be suppressed, thus enhancing reception sensitivity.

The optical link module of the present invention further comprises supporting members made of phosphor bronze for supporting the TOSA and the ROSA. By providing these members mechanical stress applied to lead pins connecting the TOSA and the ROSA to the board can be reduced.

Moreover, according to the present invention, the board has two types of pads connecting to terminal pins of an electrical connector provided in a mother board where the module is mounted thereon. The first type of pad has a configuration that an edge of the pads is extended to the board edge, while an edge of another type of pads is retreated from the board edge. This configuration enables a hot pluggable function when the ground and the power supply are provided through the another type of pads.

The optical module of the present invention has a housing including primary portion, an electrical connector receiving portion, and an optical connector receiving portion. The TOSA, the ROSA and the board are installed in the primary portion. A pair of holes connects the optical connector-receiving portion to the primary portion, the front end of the TOSA and the ROSA are inserted into the respectively holes, thus positioning the TOSA and the ROSA and coupling the optical connector to the TOSA and the ROSA, accordingly.

Further aspect of the present invention is that the TOSA and the ROSA has a plurality of lead pins sandwiching the board therebetween. This configuration enhances the productivity of the module.

The present invention will be thoroughly understood from the detailed description and attached figures shown below. They are merely used to illustrate examples of the present invention, and should not be thought of as limiting the present invention.

DESCRIPTION OF THE PREFERRED EMBODIMENT

Embodiments of the present invention will be described in detail below with reference to the attached figures. In the description, the same symbols are assigned to the same elements without overlapping explanation.

Figure 1:
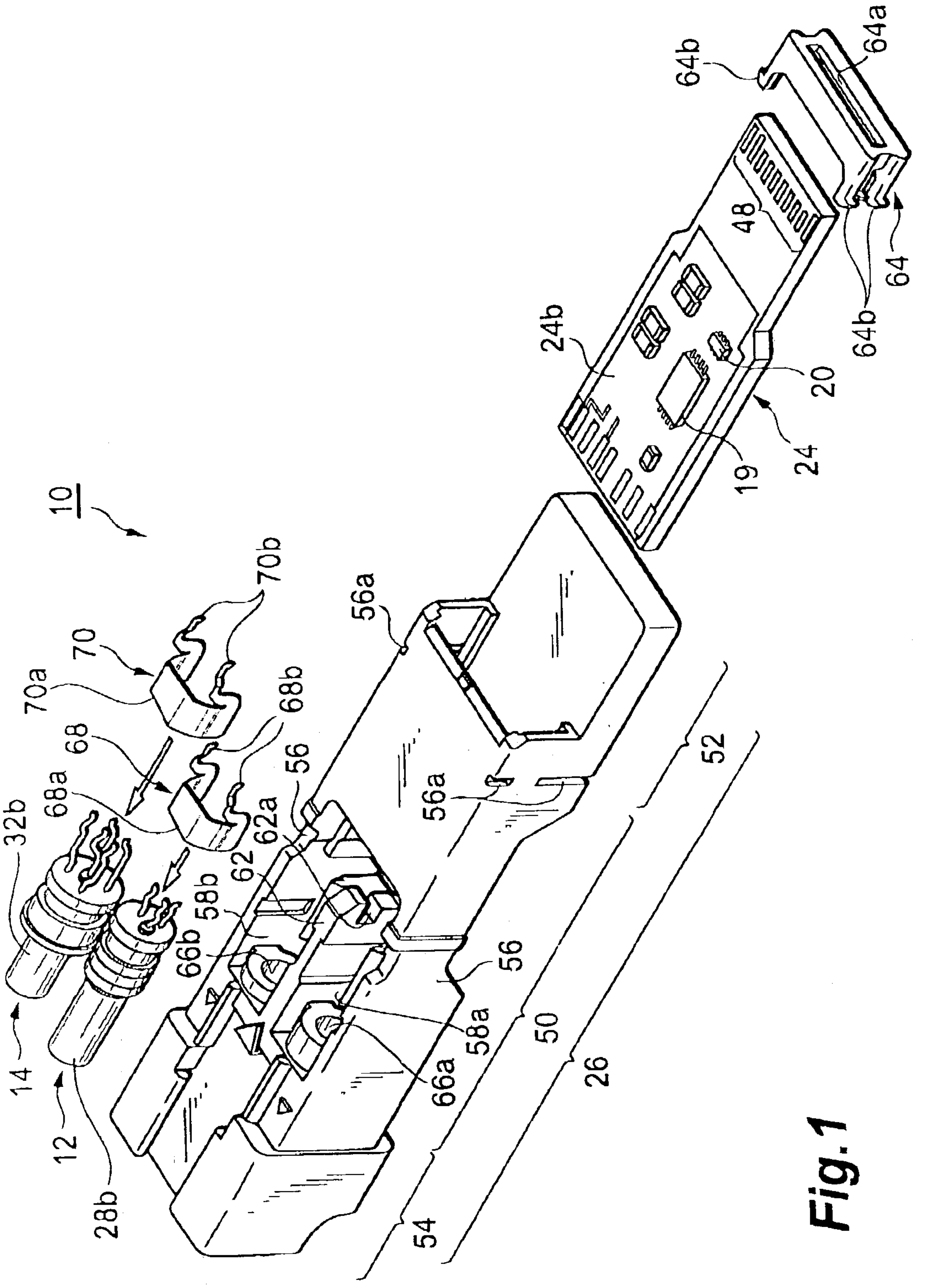
FIG. 1 is an exploded perspective view that illustrates the configuration of the optical link module of the present invention.
Figure 2A:
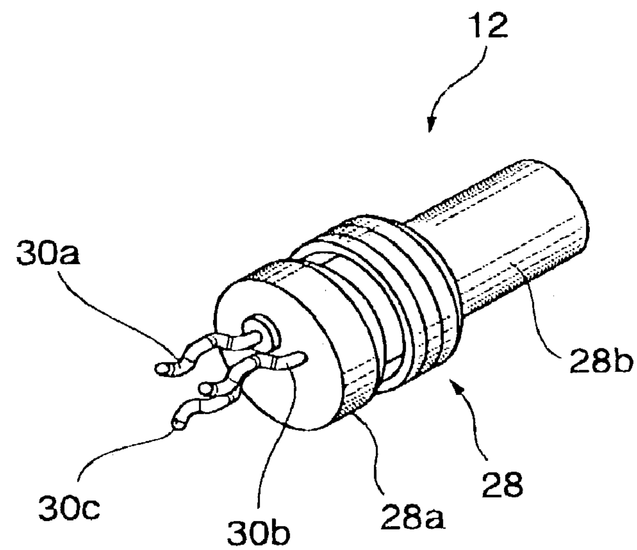
FIG. 2A is a perspective view showing the configuration of the transmitting optical sub-assembly.
Figure 2B:
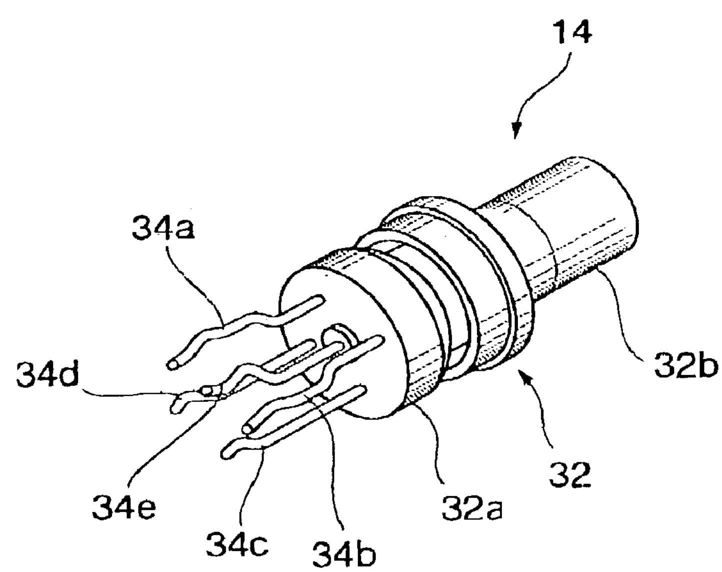
FIG. 2B is a perspective view showing the configuration of the receiving optical sub-assembly.

FIG. 1 is an exploded perspective view that illustrates the configuration of the optical link module according to the present embodiment. As shown in FIG. 1, the optical link module 10 comprises: a transmitting optical sub-assembly (TOSA) 12, a receiving optical sub-assembly (ROSA) 14, a plurality of electronic parts, a board 24 and a housing 26. The TOSA 12 has a package 28 and three lead pins **30*a* to 30*c*. A light-emitting element, such as a semiconductor laser diode, is mounted in the package. The lead pins disposed on a base 28*a* of the package 28 includes a first signal pin 30*a* in in-phase, a second signal pin 30*b* in out-phase and a signal pan 30*c* for monitoring. The signal in out-phase has an opposite phase to the signal in in-phase. The tip portions of the lead pins 30*a* to 30*c* are bent into an undulating form. The ROSA has a package 32, in which a semiconductor light-receiving element such as a photo diode is installed, a pre-amplifier and a plurality of lead pins 34***a* to 34*e* on a base 32*a* of the package. The lead pins 34*a* to 34*e* include an signal pin in in-phase 34*a*, a signal pin in out-phase, a first power supply pin 34*c* for the light-receiving element, a second power supply pin 34*d* for the pre-amplifier, and a ground pin 34*e*. The tip portions of the lead pins 34*a* to 34*e* are bent into an undulating form.

Figure 3A:
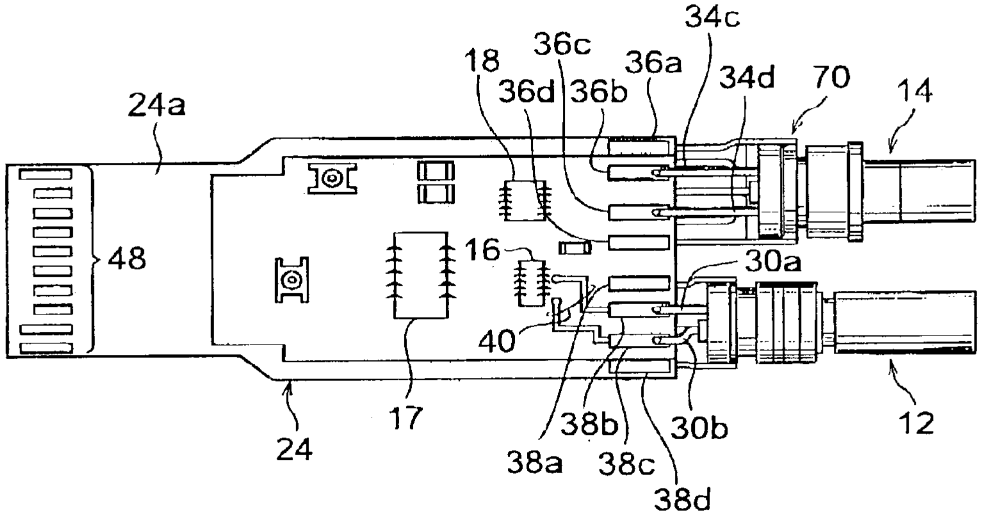
FIG. 3A is a diagram illustrating the configuration of the front surface of the board.

The board 24 is multi-layered printed circuit board made of a resin, the external shape of which is nearly rectangle. A plurality of electronic parts is mounted on both the front surface 24*a* and the back surface 24*b* of the board. As shown in FIG. 3A, the electronic parts requiring the wire-bonding are mounted only on the front surface 24*a* of the board. Integrated circuits in a die configuration, such as the driver IC 16, Auto Power control IC 17, and Recover-Regenerate IC, are necessary for the wire-bonding to electrically connect to each other. Another electronic part not requiring the wire-bonding, such as chip resistor and chip capacitors, are also mounted on the front surface 24*a* of the board.

Only electronic parts not requiring the wire-bonding are mounted on the back surface 24*b* of the board. Integration circuit in a packaged configuration, such EEPROM 19 and Inserter 20, are typical example of them. Information of the specifications and the serial number of the module are stored in the EEPROM 19. Another electronic parts not requiring the wire-bonding are mounted on the back surface 24*b* of the board.

Figure 3B:
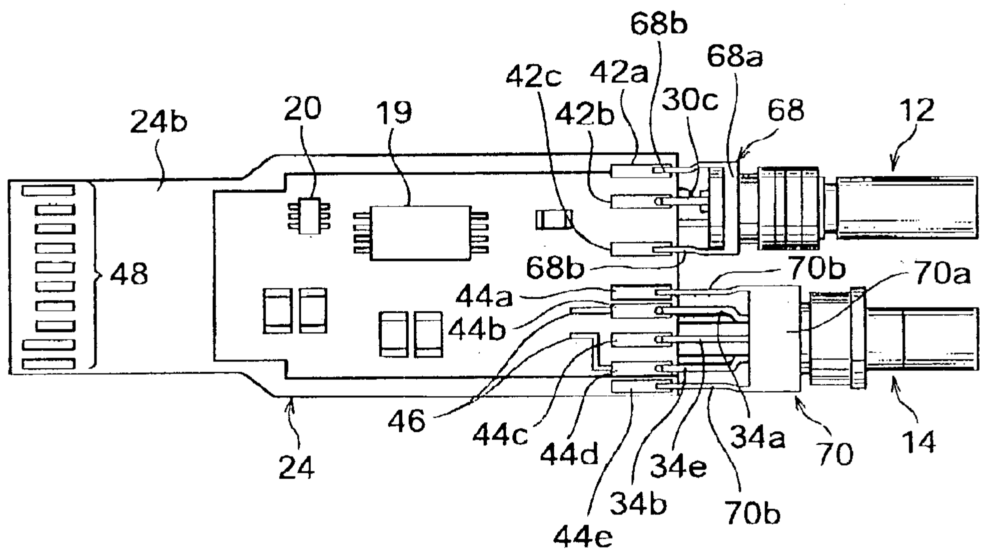
FIG. 3B is a diagram illustrating the configuration or the back surface of the board.

Several pads 36*a* to 36*d*, and also 38*a* to 38*d* are provided on the edge portion of the front surface 24*a* of the board. The former pads 36*a* to 36*d* include a pad 36*b* for providing a first power supply to the light-receiving element, a pad 36*c* for providing a second power supply to the pre-amplifier, and a pad 36*d* for ground. The pad 38*a* to 38*d* include a pad 38*a* for providing a second power supply to the light-emitting element, a pad 38*b* for a signal in in-phase, and a pad 38*c* for a signal input-phase. Conductive pattern 40 is connected from pads for signal 38*b* and 38*c* to the driver IC 16. As shown in FIG. 3B, several pads 42*a* to 42*c* and also 44*a* to 44*e* are provided on the edge portion of the back surface 24*b* of the board. The pads 42*a* and 42*c* provide a second power supply and ground to the light-emitting element in the TOSA, respectively. While the pad 42*b* leads a signal from the light-emitting element. Similarly, the pads 44*a* provides a ground potential, the pads 44*c* and 44*d* provides for a signal in in-phase and that in out-phase, respectively. Conductive pattern 46 is led from the pads 44*b* and 44*c*. These patterns 46 are connected to the front surface 24*a* of the board through via holes, they are not shown in the figure. Thus, the transmitting circuit and the receiving circuit are isolated to each other by mounting on the respective surface of the board.

Figure 4:
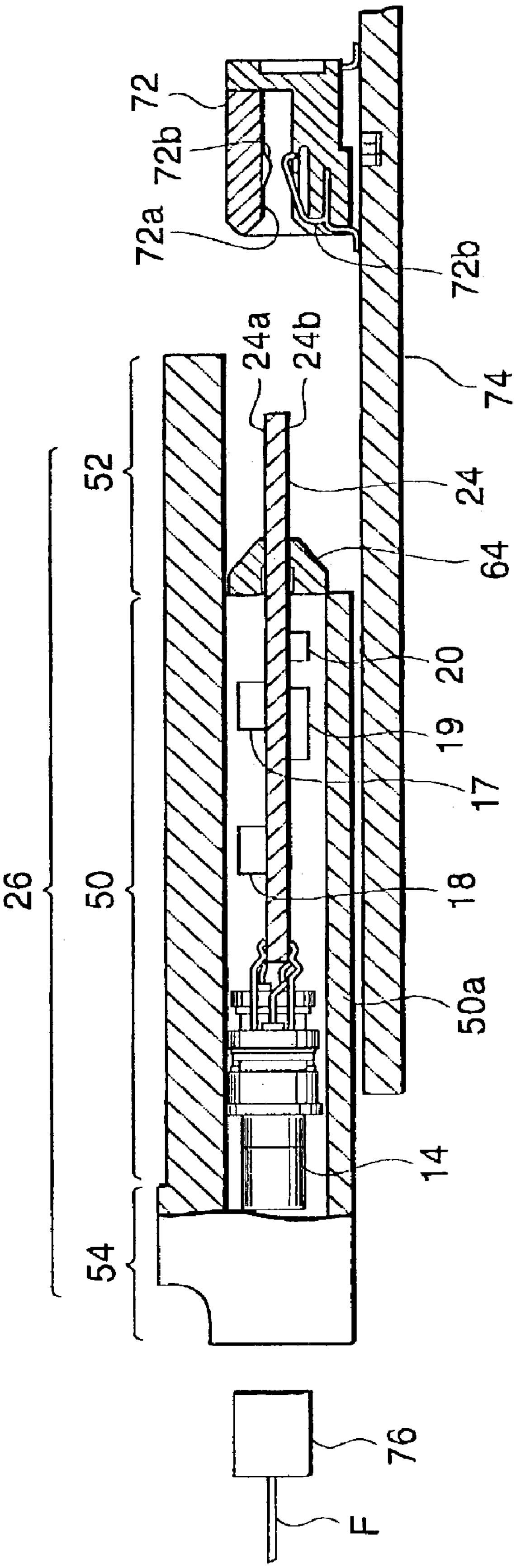
FIG. 4 is a sectional view showing the configuration of the optical link module of the present invention.
Figure 5:
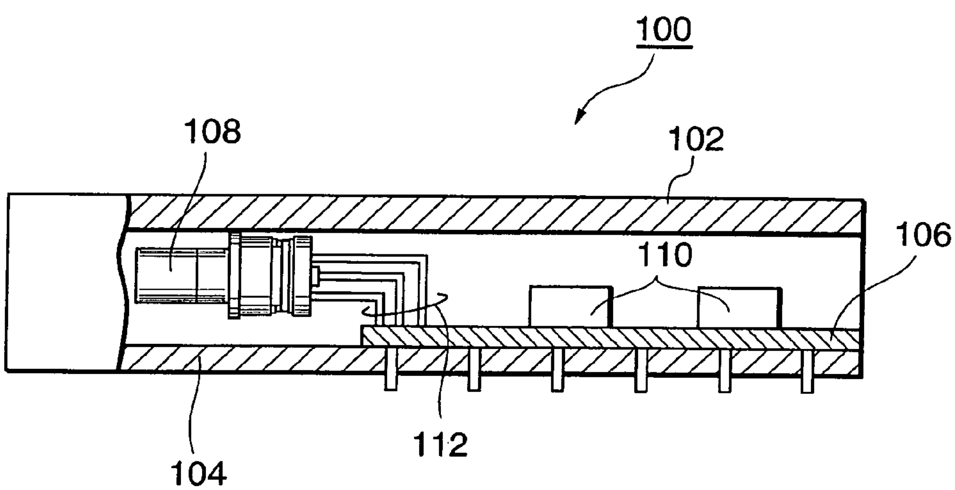
FIG. 5 is a sectional view showing the configuration of a conventional link module.

Another pads connected to a host connector 72 in FIG. 4 are provided on a edge portions of the front surface 24*a* and the back surface 24*b* of the board. These pads includes a ground, a power supply and signal lines.

As shown in FIG. 1, the housing comprises a primary portion 50, an electrical connector-receiving portion 52, and an optical connector-receiving portion 54. The electrical connector-receiving portion is disposed on one end of the primary portion 50, while the optical connector-receiving portion is disposed on the other end of the primary portion. The primary portion has a pair of side wall 56. The inner space surrounded by the pair of side wall 56 enclosed the optical sub-assemblies therein. The space is partitioned into a TOSA-receiving portion 58*a* and a ROSA-receiving portion 58*b* by a partition wall 62 that extends along the side wall 56. A groove 62*a* positioning the board 24 therein is formed in the rear end of the partition wall 62. Another grooves 56*a* anchoring a board holder thereto are formed in the inner surface of the respective side walls 56.

The optical connector-receiving portion 54 has a receptacle, which is not shown in the figures, optical connectors 76 in FIG. 4 attached to optical fibers F in FIG. 4 are inserted therein. A hole 66*a* connects the TOSA-receiving portion 58*a* to the receptacle by inserting the sleeve 28*b* into the hole 58*a*, while another hole 66*b* connects the ROSA-receiving portion 58*b* to the receptacle by inserting a sleeve 32 into the hole 68*b*.

The board 24 is installed in the primary portion by inserting from the side of the electrical connector-receiving portion 52. The front end of the board 24 is mated with the groove 62*a* of the partition wall 62 so as to position it in forward-backward direction and also in the up-down direction. Further, a board holder 64 secures the board 24. The board holder 64 is annular with an opening 64 through which the board 24 is passed. Projections 64*b* are disposed on both side of the board holder 64. These projections 64*b* made with grooves 56*a* formed in the side walls of the housing, so that the board holder 64 is anchored to the primary portion of the housing. When the board 24 is installed inside the housing 26, the TOSA is fixed to the board 24 by clamping with three lead pins 30*a* to 30*c*, and the ROSA is fixed to the board by clamping with five lead pins 34*a* to 34*e*.

As shown in FIGS. 3A and 3B, the TOSA clamps the board 24 by three pins 30*a* to 30*c* therebetween. The lead pin 30*a* is connected to the pad 38*a* on the front surface 24*a*, while the lead pin 30*b* is connected to the pad 30*c*. Moreover, the lead pin 30*c* is connected to the pad 42*b* provided on the back surface 24*b* of the board. Since these lead pins 30*a* to 30*c* and pads 38*b*, 38*c* and 42*b* are soldered, furthermore, lead pins 30*a* to 30*c* has a spring characteristic, the board 24 is secured so as to improve the productivity of the module. Similar situation is revealed in the ROSA. The ROSA clamps the board 24 by five lead pins 34*a* to 34*e* therebetween. The lead pin 34*c* and 34*d* are connected to the pad 36*b* and 36*c* on the front surface, respectively. While the lead pin 34*a,* 34*e* and 34*b* are connected to the pad 44*b*, 44*c*, and 44*d* on the back surface of the board, respectively. Since these lead pins are soldered to corresponding pads and have some elastic characteristic, the board 24 is secured so as to improve the productivity of the module.

The TOSA and the ROSA further provide supporting members 68 and 70, respectively. The supporting members 68 and 70 are made of phosphor bronze with gold-plated surfaces. These supporting members comprise supporting portions 68*a* and 70*a* that support the packages 28 and 32 and pairs of arm portions 68*b* and 70*b* attached to the board 24. The pair of arm portions 68*b* of the supporting member 68 are soldered to the pads 42*a* and 42*c* on the back surface 24*b* of the board, respectively. While, the pair of arm portions 70*b* are soldered to the pads 44*a* and 44*e* on the back surface so as to support the package 32 at the supporting portions 70*a*. Thus, since the supporting members 68 and 70 hold the TOSA and the ROSA, respectively, the stress applied to the lead pins can be reduced. Moreover, the pair of arm portions 68*b* is soldered to the pads 42*a* and 42*c* and the pads provide the power supply, which stables the operation of the light-emitting element. Similarly, since the pair of arm portions 70*b* are soldered to the pads 44*a* and 44*e*, which are connected to the power supply and the ground, respectively, the operation of the light-receiving element and the pre-amplifier can be maintained in stable.

Such an optical link module 10 is mounted on a mother board 74, an electrical connector 72 is provided thereon, as shown in FIG. 4. The electrical connector 72 has an opening 72*a* that receives the board 24 and a plurality of terminal pins 72*b* in the opening. The terminal pins are electrically connected to the pads 48 on the rear edge portion of the board 24. As shown in FIGS. 3A and 3B, a combination of the pads 48 is that the outermost pads have a longer size and extends to the edge of the board 24, while the edge of the inner pads are retreated from the edge of the board 24. When the optical module 10 is mounted on the mother board 74, the electrical connector 72 receives the connector-receiving portion 54 of the housing 26, and the rear edge of the board 24 mates with the opening 72*a*. The outermost pads among the pads 48 on the board 24 are first connected to the terminal pins 72*b* of the connector 72. When the optical module 10 is dismounted by pulling the board 24 from the opening 72*a*. The outermost pads among the pads 48 are finally detached from the terminal pins. When the outermost pads provide the ground and the power supply, this configuration realizes a hot plug function.

In the optical link module 10 of the present embodiment, electronic parts are mounted on berth the front surface 24*a* and the back surface 24*b*. Accordingly, the area in which the electronic parts are mounted can be broadened without increasing the size of the board, thus achieving a higher degree of integration without increasing the size of the module. Since electronic parts requiring the wire-bonding, such as the driver IC 16, APC-IC 17 and 2R-IC 18, are mounted on the front surface 24*a*, the wire bonding performs only in the front surface 24*a*. Consequently, the productivity of the module can be enhanced.

Further, since the transmitting circuit 40 are provided on the front surface 24*a*, while the receiving circuit 46 are disposed on the back surface 24*b*, the crosstalk between the transmitting circuit and the receiving circuit can be suppressed, which enhances the reception sensitivity. In the optical module 10, since the pads 44*b* and 44*d* of the receiving circuit are formed between the ground pads 44*a*, 44*c*, and 44*e*, which emulates the coplanar configuration, the distortion of the electrical signal can be effectively suppressed. Moreover, since the pads 48 has a configuration that the outermost parts are elongated and first connected to the corresponding terminal pins in the electrical connected when the module is inserted, the hot pluggable function can be attained.

The present invention is not limited to the embodiment described above, and various alterations are considered. For example, electronic parts requiring the wire-bonding were mounted only on the front surface 24*a*, it would be also possible to mount such parts only on the back surface 24*b*. Such modifications cannot be recognized as that departing from the scope of the present invention, all improvements that are obvious to a person skilled in the art are included in the claims of the present invention.

What is claimed is:

1. An optical link module installed on a mother board, the module having a transmitting circuit and a receiving circuit, comprising:

a transmitting optical sub-assembly electronically connected to the transmitting circuit;

a receiving optical sub-assembly electronically connected to the receiving circuit;

a board having a first surface and a second surface opposite to the first surface; and a plurality of electronic parts electronically connected to the board by wire bonding, the electronic parts being mounted only on one of the first surface and the second surface of the board, wherein the transmitting circuit is disposed on one of the first and the second surface of the board and the receiving circuit is disposed on the other surface of the board.

2. An optical link module installed on a mother board, the module having a transmitting circuit and a receiving circuit, comprising:

a transmitting optical sub-assembly electronically connected to the transmitting circuit;

a first supporting member for supporting the transmitting optical sub-assembly, the first supporting member having a supporting portion and a pair of arm portions extended from the supporting portion and connected to the board;

a receiving optical sub-assembly electronically connected to the receiving circuit;

a board having a first surface and a second surface opposite to the first surface; and a plurality of electronic parts electronically connected to the board by wire bonding, the electronic parts being mounted only on one of the first surface and the second surface of the board.

3. The optical link module according to claim 2, wherein the first supporting member is made of phosphor bronze.

4. An optical link module installed on a mother board, the module having a transmitting circuit and a receiving circuit, comprising:

a transmitting optical sub-assembly electronically connected to the transmitting circuit;

a receiving optical sub-assembly electronically connected to the receiving circuit;

a second supporting member for supporting the receiving optical sub-assembly, the second supporting member having a supporting portion and a pair of arm portions extended from the supporting portion and connected to the board;

a board having a first surface and a second surface opposite to the first surface; and a plurality of electronic parts electronically connected to the board by wire bonding, the electronic parts being mounted only on one of the first surface and the second surface of the board.

5. The optical link module according to claim 4, wherein the second supporting member is made of phosphor bronze.

6. An optical link module installed on a mother board, the module having a transmitting circuit and a receiving circuit, comprising:

a transmitting optical sub-assembly electronically connected to the transmitting circuit;

a receiving optical sub-assembly electronically connected to the receiving circuit;

a board having a first surface and a second surface opposite to the first surface;

a plurality of electronic parts electronically connected to the board by wire bonding, the electronic parts being mounted only on one of the first surface and the second surface of the board; and a housing having a primary portion, an electrical connector-receiver portion, and an optical connector-receiver portion, the primary portion having a partition wall, a transmitting optical sub-assembly receiving portion, and a receiving optical sub-assembly receiving portion, the partition wall partitioning the transmitting optical sub-assembly receiving portion and the receiving optical sub-assembly receiving portion.

7. The optical link module according to claim 6, wherein the housing further comprises a pair of holes, one of the hole connecting the optical connector receiving portion to the transmitting optical sub-assembly receiving portion and the other hole connecting the optical connector receiving portion to the receiving optical sub-assembly receiving portion.

8. The optical link module according to claim 7, wherein the transmitting optical sub-assembly further comprises a sleeve being inserted into the one of hole so as to position the transmitting optical sub-assembly.

9. The optical link module according to claim 7, wherein the receiving optical sub-assembly further comprises a sleeve being inserted into the other hole so as to position the receiving optical sub-assembly.

10. An optical link module installed on a mother board, the module having a transmitting circuit and a receiving circuit, comprising:

a transmitting optical sub-assembly electronically connected to the transmitting circuit;

a receiving optical sub-assembly electronically connected to the receiving circuit;

a board having a first surface and a second surface opposite to the first surface; and a plurality of electronic parts electronically connected to the board by wire bonding, the electronic parts being mounted only on one of the first surface and the second surface of the board, wherein the transmitting optical sub-assembly has a plurality of lead pins sandwiching the board therebetween and the receiving optical sub-assembly has a plurality of lead pins sandwiching the board therebetween.

11. The optical link module according to claim 4, further comprising a first supporting member for supporting the transmitting optical sub-assembly, the first supporting member having a supporting portion and a pair of arm portions extended from the supporting portion of the first supporting member and connected to the board.

* * * * *